United States Patent

Epler

(10) Patent No.: US 8,076,682 B2
(45) Date of Patent: Dec. 13, 2011

(54) CONTACT FOR A SEMICONDUCTOR LIGHT EMITTING DEVICE

(75) Inventor: John E. Epler, San Jose, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 135 days.

(21) Appl. No.: 12/506,632

(22) Filed: Jul. 21, 2009

(65) Prior Publication Data

US 2011/0018015 A1    Jan. 27, 2011

(51) Int. Cl.
*H01L 33/00* (2010.01)
(52) U.S. Cl. ........ 257/94; 257/98; 257/99; 257/E33.067
(58) Field of Classification Search .................... 257/79, 257/94, 98, 99, E33.067
See application file for complete search history.

(56) References Cited

U.S. PATENT DOCUMENTS

| | | | |
|---|---|---|---|
| 4,564,997 A | 1/1986 | Matsuo et al. | |
| 6,900,472 B2 | 5/2005 | Kondoh et al. | |
| 6,946,685 B1 | 9/2005 | Steigerwald et al. | |
| 2006/0060872 A1 | 3/2006 | Edmond et al. | |
| 2006/0060874 A1 | 3/2006 | Edmond et al. | |
| 2006/0255358 A1 | 11/2006 | Shum | |
| 2008/0258133 A1* | 10/2008 | Seong .............................. | 257/14 |
| 2010/0051978 A1* | 3/2010 | Katsuno et al. .................. | 257/94 |

FOREIGN PATENT DOCUMENTS

| | | |
|---|---|---|
| EP | 1168460 A2 | 1/2002 |
| EP | 1793429 A1 | 5/2007 |
| JP | 5568655 A | 5/1980 |
| WO | 2009039820 A1 | 4/2009 |

OTHER PUBLICATIONS

M. Saka et al. Entitled: "Fabrication of AG Micromaterials by Utilizing Stress-Induced Migration", Department ofNanomechanics, Graduate School of Engineering, Tohoku University Aoba Jun. 6, 2001, Aramaki, Aoba-ku, Sendai 980-8579, Japan, IEEE, 2nd Electronics SystemIntegration Technology Conference, Greenwich, UK, pp. 507-510.

* cited by examiner

*Primary Examiner* — Cuong Q Nguyen
*Assistant Examiner* — Tran Tran

(57) ABSTRACT

A semiconductor structure includes a light emitting layer disposed between an n-type region and a p-type region. A p-electrode is disposed on a portion of the p-type region. The p-electrode includes a reflective first material in direct contact with a first portion of the p-type region and a second material in direct contact with a second portion of the p-type region adjacent to the first portion. The first material and second material are formed in planar layers of substantially the same thickness.

8 Claims, 2 Drawing Sheets

CONTACT FOR A SEMICONDUCTOR LIGHT EMITTING DEVICE

FIELD OF INVENTION

The present invention relates to a reflective contact for a III-nitride light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions. III-nitride devices are often formed as inverted or flip chip devices, where both the n- and p-contacts formed on the same side of the semiconductor structure, and light is extracted from the side of the semiconductor structure opposite the contacts.

Silver is often used as a reflective p-contact and is known to be susceptible to transport induced by mechanical stress, chemical reaction, or electromigration. For example, a III-nitride LED with a silver p-contact is illustrated in FIG. 1 and described in U.S. Pat. No. 6,946,685. U.S. Pat. No. 6,946,685 teaches "silver electrode metallization is subject to electrochemical migration in the presence of moisture and an electric field, such as, for example, the field developed as a result of applying an operating voltage at the contacts of the device. Electrochemical migration of the silver metallization to the pn junction of the device results in an alternate shunt path across the junction, which degrades efficiency of the device.

FIG. 1 illustrates a light emitting device including a semiconductor structure that includes a light-emitting active region 130A between an n-type layer 120 of III-V nitride semiconductor and a p-type layer 140 of III-V nitride semiconductor. A p-electrode 160 comprising silver metal is deposited on the p-type layer, and an n-electrode (not shown in FIG. 1) is coupled with the n-type layer. Means are provided by which electrical signals can be applied across said electrodes to cause light emission from the active region, and a migration barrier 175 is provided for preventing electrochemical migration of silver metal from the p-electrode toward the active region. The migration barrier 175 is a conducting guard sheet. The guard sheet encompasses the silver thoroughly, covering the edges of the silver p-electrode, as illustrated in FIG. 1.

SUMMARY

It is an object of the present invention to include in a p-electrode a reflective first material and a second material. In some embodiments, the second material may reduce migration of the first material. The reflectivity of the contact may be improved over a device with a silver contact and a guard sheet that encompasses the silver contact.

Embodiments of the invention include a semiconductor structure comprising a light emitting layer disposed between an n-type region and a p-type region. A p-electrode is disposed on a portion of the p-type region. The p-electrode includes a reflective first material in direct contact with a first portion of the p-type region and a second material in direct contact with a second portion of the p-type region adjacent to the first portion. The first material and second material are formed in planar layers of substantially the same thickness.

DETAILED DESCRIPTION

Figure 1:
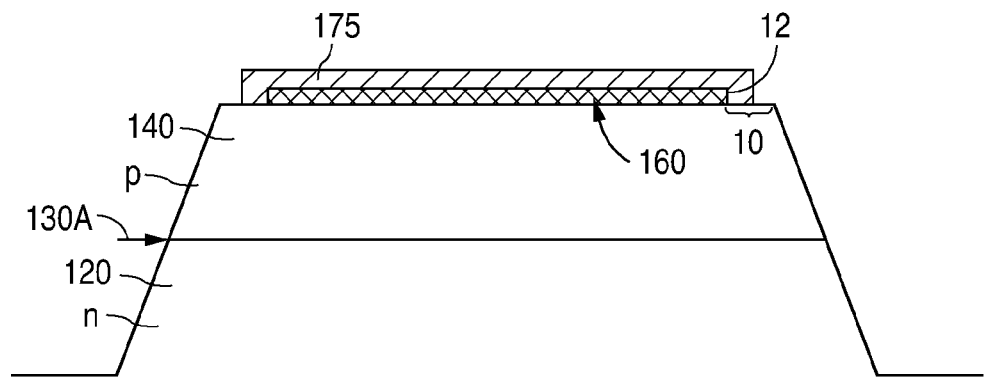
FIG. 1 illustrates a light emitting device with a migration barrier covering a silver p-electrode.

In the device illustrated in FIG. 1, in order to seal the silver contact with a guard sheet, the silver is first etched back from the edge of the mesa. The band 10 between the edge of the reflective p-electrode 160 and the edge of the mesa is referred to as the "black belt" because it is not as reflective as silver p-electrode 160. The black belt may be, for example, about 10 microns wide and may represent about 7% of the device area. Absorption of light by the black belt may reduce the efficiency of the device. In addition, the step 12 created at the edge of silver p-electrode 160 is difficult to seal with guard sheet 175 and therefore prone to incursion of humidity and out-migration of silver. To minimize the height of step 12, the silver p-electrode 160 is kept as thin as possible, for example about 150 nm. Stability and reflectivity of the silver p-electrode may benefit from thicker silver layers, for example about 200 nm.

In embodiments of the invention, after etching back the silver p-contact, the black belt is filled with a metal layer of the same thickness as the silver. The nearly-planar p-contact structure may be more reflective and better sealed than a conventional contact, such as the contact illustrated in FIG. 1.

Figure 2:
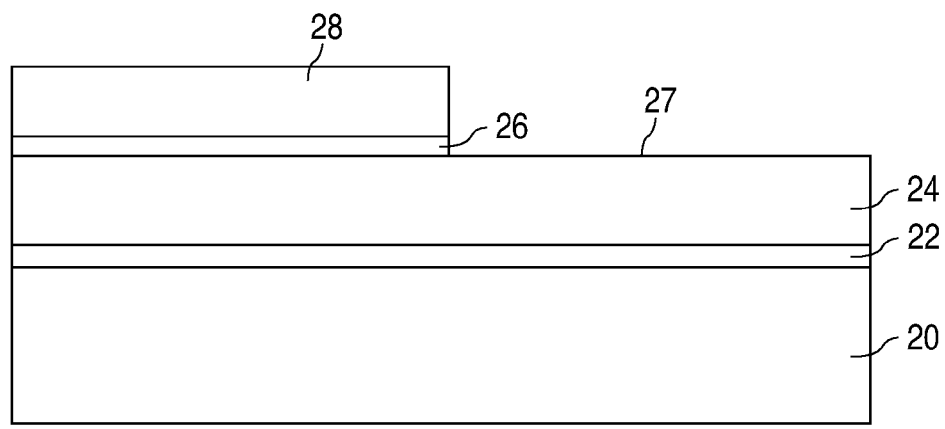
FIG. 2 illustrates a portion of a III-nitride device with a silver p-contact patterned with photoresist.
Figure 3:
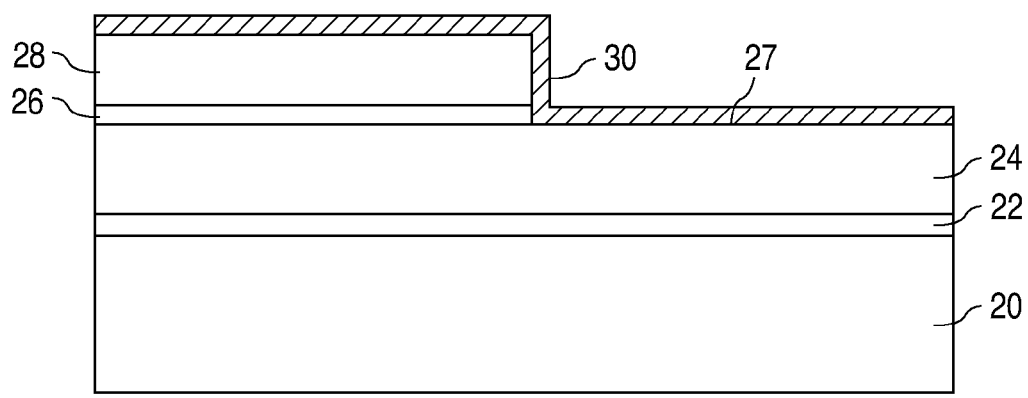
FIG. 3 illustrates the device of FIG. 2 after forming a layer over the patterned silver p-contact.
Figure 4:
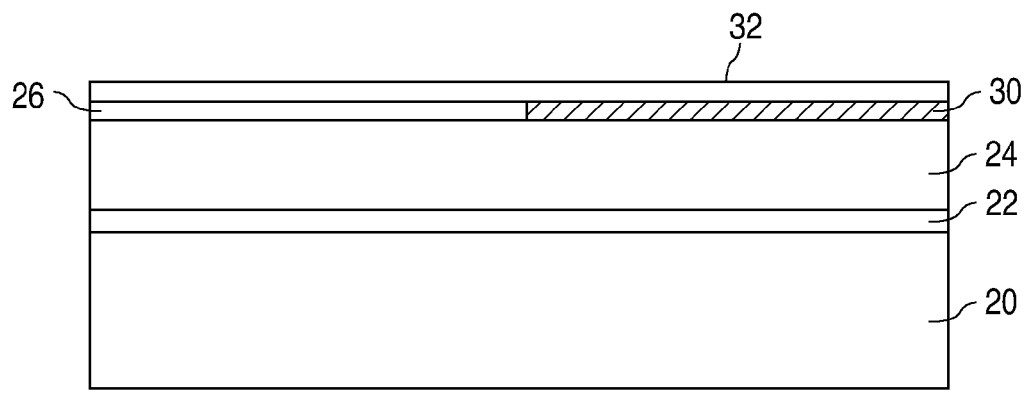
FIG. 4 illustrates the device of FIG. 3 after lifting off the photoresist and forming a guard sheet over the p-electrode.

FIGS. 2-4 illustrate forming a reflective contact according to embodiments of the invention. Only a portion of a device is illustrated in FIGS. 2-4. In FIG. 2, a III-nitride semiconductor structure including an n-type region, a light emitting or active region, and a p-type region is grown over a growth substrate (not shown), which may be any suitable growth substrate and which is typically sapphire or SiC. An n-type region 20 is grown first over the substrate. The n-type region may include multiple layers of different compositions and dopant concentration including, for example, preparation layers such as buffer layers or nucleation layers, which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

A light emitting or active region 22 is grown over the n-type region 20. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 24 is grown over the light emitting region 22. Like the n-type region, the p-type region may include multiple layers of different composition, thickness, and dopant concentration, including layers that are not intentionally doped, or n-type layers.

A reflective metal p-contact 26 is formed on p-type region 24. Reflective metal 26 usually includes silver, and may be pure silver, an alloy including silver, or one or more silver layers and one or more layers of a different metal, such as nickel, or other conductive material. Reflective metal 26 is between 150 and 250 nm thick in some embodiments. A resist layer 28 is formed over reflective metal 26 and patterned, then a portion of reflective metal 26, for example in the black belt region 27, is removed. The portion of reflective metal 26 under resist layer 28 remains in the device. By adjusting the etch time, the reflective metal 26 may be removed from under the resist layer 28 up to a distance of a few microns commonly referred to as undercut.

In FIG. 3, resist layer 28 and black belt 27 are covered with a layer 30 of approximately the same thickness as reflective metal 26. For example, layer 30 is between 150 and 250 nm thick in some embodiments. Layer 30 is selected to be as reflective as possible, without the migration problems of silver. Layer 30 may be, for example, a single evaporated aluminum layer, one or more sputtered aluminum layers, one or more aluminum alloys, an aluminum metal stack such as AlTi, or a non-metal layer such as an $Al_2O_3$/Al bilayer or a $SiO_2$/Al bilayer for enhanced reflectivity. The gap between reflective metal 26 and layer 30 may be adjusted from zero to less than two microns by controlling the undercut of the reflective metal 26 and selecting an appropriate deposition technique of layer 30.

The resist layer 28 is then lifted off, exposing reflective metal 26 and leaving behind layer 30 in the black belt 27. In FIG. 4, a guard sheet 32 is formed over the p-electrode, which includes reflective metal 26 and layer 30. Guard sheet 32 may be, for example, one or more metals such as titanium, tungsten, or one or more alloys, or one or more dielectrics for improved reflectivity, such as $SiN_x$, $SiO_x$, or $Al_2O_3$. In some embodiments, guard sheet 32 is a layer of TiWN sandwiched between two layers of TiW. In some embodiments, layer 30 is AlTi and guard sheet 32 includes at least one layer of TiW. AlTi may provide enhanced adhesion to a TiW guard sheet layer. In some embodiments, the guard sheet includes an underlayer and/or overlayer such as nickel for improved adhesion.

Figure 5:
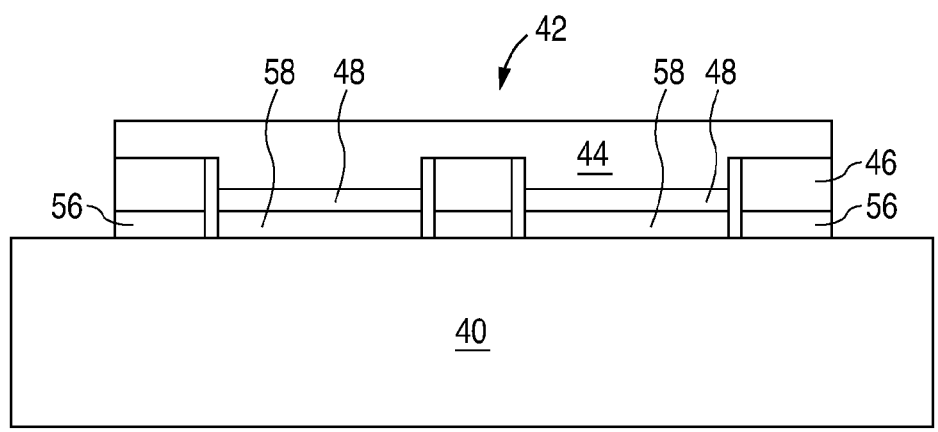
FIG. 5 illustrates a III-nitride device connected to a mount.

FIG. 5 illustrates an LED 42 connected to a mount 40. Before or after forming the above-described p-electrode on p-type region 24, portions of an n-type region are exposed by etching away portions of the p-type region and the light emitting region. The semiconductor structure, including n-type region 20, light emitting region 22, and p-type region 24 is represented by structure 44 in FIG. 3. N-contacts 46 are formed on the exposed portions of the n-type region.

LED 42 is bonded to mount 40 by n- and p-interconnects 56 and 58. Interconnects 56 and 58 may be any suitable material, such as solder or other metals, and may include multiple layers of materials. In some embodiments, interconnects include at least one gold layer and the bond between LED 42 and mount 40 is formed by ultrasonic bonding.

During ultrasonic bonding, the LED die 42 is positioned on a mount 40. A bond head is positioned on the top surface of the LED die, often the top surface of a sapphire growth substrate in the case of a III-nitride device grown on sapphire. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the LED die to vibrate, often at an amplitude on the order of microns. The vibration causes atoms in the metal lattice of a structure on the LED 42 to interdiffuse with a structure on mount 40, resulting in a metallurgically continuous joint. Heat and/or pressure may be added during bonding.

After bonding LED die 42 to mount 40, all or part of the substrate on which the semiconductor layers were grown may be removed by any technique suitable to the particular growth substrate removed. For example, a sapphire substrate may be removed by laser lift off. After removing all or part of the growth substrate, the remaining semiconductor structure may be thinned, for example by photoelectrochemical etching, and/or the surface may be roughened or patterned, for example with a photonic crystal structure. A lens, wavelength converting material, or other structure known in the art may be disposed over LED 42 after substrate removal.

Embodiments described above may have several advantages over the structure illustrated in FIG. 1. The p-electrode structure in the embodiments above may be more planar, thereby reducing stress concentration points and improving the integrity of the guard sheet by eliminating the need for the guard sheet to cover a step. The reflective metal may be made thicker without enhancing the problems related to covering a step at the edge of the reflective metal with a guard sheet. Optical losses from the chip may be reduced by reducing the amount of light absorbed by the black belt. Problems associated with silver peeling off the underlying semiconductor material may be reduced, as layer 30 may protect the edges of reflective metal 26 during subsequent processing. An aluminum layer 30 may serve as a sacrificial anode, which may inhibit or delay silver electro-corrosion. Silver migration in the black belt may be reduced by the high electrical conductivity and lower electric field of an aluminum layer 30.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:
1. A device comprising:
   a semiconductor structure comprising a light emitting layer disposed between an n-type region and a p-type region; and
   a p-electrode disposed on a portion of the p-type region, the p-electrode comprising:
      a reflective first material in direct contact with a first portion of the p-type region; and
      a second material in direct contact with a second portion of the p-type region adjacent to the first portion;

wherein the first material and second material are different materials and are formed in planar layers of substantially the same thickness.

2. The device of claim 1 wherein the first material comprises silver.

3. The device of claim 1 wherein the second material comprises aluminum.

4. The device of claim 1 wherein the second material comprises one of an aluminum alloy, an aluminum metal stack, AlTi, an $Al_2O_3$/Al bilayer, and a $SiO_2$/Al bilayer.

5. The device of claim 1 wherein:
a portion of the p-type region and light emitting layer are etched away to reveal a portion of the n-type region; and
a remaining portion of the p-type region forms a mesa; wherein the second material is disposed between the first material and an edge of the mesa.

6. The device of claim 1 wherein the p-electrode further comprises a third material disposed over the first and second material, wherein the third material is configured to prevent migration of the first material.

7. The device of claim 1 wherein the p-electrode further comprises a third material disposed over the first and second material, wherein a bottom surface of the third material is in direct contact with both the first material and the second material.

8. The device of claim 6 wherein the third material comprises titanium and tungsten.

* * * * *